United States Patent
Bai et al.

(10) Patent No.: US 11,146,259 B2
(45) Date of Patent: Oct. 12, 2021

(54) VOLTAGE EQUALIZATION METHOD FOR USE IN RADIOFREQUENCY SWITCH HAVING MULTIPLE TRANSISTORS CONNECTED IN SERIES AND RADIOFREQUENCY SWITCH

(71) Applicant: VANCHIP (TIANJIN) TECHNOLOGY CO., LTD., Tianjin (CN)

(72) Inventors: Yunfang Bai, Tianjin (CN); Sheng Lin, Tianjin (CN)

(73) Assignee: VANCHIP (TIANJIN) TECHNOLOGY CO., LTD., Tianjin (CN)

( * ) Notice: Subject to any disclaimer, the term of this patent is extended or adjusted under 35 U.S.C. 154(b) by 179 days.

(21) Appl. No.: 16/474,714

(22) PCT Filed: Dec. 31, 2017

(86) PCT No.: PCT/CN2017/120456
§ 371 (c)(1),
(2) Date: Jun. 28, 2019

(87) PCT Pub. No.: WO2018/121790
PCT Pub. Date: Jul. 5, 2018

(65) Prior Publication Data
US 2021/0135665 A1 May 6, 2021

(30) Foreign Application Priority Data
Dec. 31, 2016 (CN) .......................... 201611269013.4

(51) Int. Cl.
*H03K 17/10* (2006.01)
*H01L 23/52* (2006.01)
*H01L 23/522* (2006.01)

(52) U.S. Cl.
CPC ....... *H03K 17/102* (2013.01); *H01L 23/5223* (2013.01)

(58) Field of Classification Search
CPC .......................... H03K 17/102; H01L 23/5223
See application file for complete search history.

(56) References Cited

U.S. PATENT DOCUMENTS 8,604,864 B2 * 12/2013 Ranta .................. H03K 17/687
327/427
9,484,973 B1 * 11/2016 Carroll ................ H03K 17/693
(Continued)

FOREIGN PATENT DOCUMENTS

CN 103390609 A 11/2013
CN 103973291 A 8/2014
(Continued)

OTHER PUBLICATIONS

Extended European Search Report from EP app. No. 17889005.9, dated Oct. 13, 2020.
(Continued)

*Primary Examiner* — Dinh T Le
(74) *Attorney, Agent, or Firm* — Ladas & Parry, LLP

(57) ABSTRACT

A voltage equalization method for use in a radiofrequency switch having multiple transistors connected in series and the radiofrequency switch. In the voltage equalization method, capacitors are additionally provided as parasitic capacitances between source electrodes and drain electrodes of transistors (M1-MN) connected in series to compose a radiofrequency switch, and voltage drop uniformity is implemented for the transistors (M1-MN) by adjusting the parasitic capacitances of the transistors (M1-MN). By means of different combinations of the positions, sizes, and spacing of metal bars on a first metal layer (1) and on a second metal layer (2), the parasitic capacitances between the source electrodes and the drain electrodes of the transistors (M1-
(Continued)

MN) can be finely adjusted, thus increasing the voltage drop uniformity of the transistors (M1-MN). The method uses less transistors to accomplish the design of the radiofrequency switch.

9 Claims, 2 Drawing Sheets

(56) References Cited

U.S. PATENT DOCUMENTS

| | | | |
|---|---|---|---|
| 9,847,781 B2* | 12/2017 | Na | H03K 17/62 |
| 10,236,834 B2* | 3/2019 | Ishihara | H03F 3/195 |
| 2008/0265978 A1 | 10/2008 | Englekirk | |
| 2013/0002338 A1* | 1/2013 | Kondo | H01L 29/94 |
| | | | 327/419 |
| 2015/0303982 A1 | 10/2015 | Yang et al. | |
| 2015/0318852 A1 | 11/2015 | Hoogzaad et al. | |
| 2015/0340322 A1 | 11/2015 | Mason et al. | |
| 2016/0071811 A1 | 3/2016 | Fuh et al. | |

FOREIGN PATENT DOCUMENTS

| | | |
|---|---|---|
| CN | 104681562 A | 6/2015 |
| CN | 104733392 A | 6/2015 |
| CN | 105742363 A | 7/2016 |
| CN | 106656128 A | 5/2017 |

OTHER PUBLICATIONS

Written Opinion of the International Searching Authority from PCT/CN2017/120456, dated Mar. 30, 2018, with English translation from WIPO.

International Preliminary Report on Patentability from PCT/CN2017/120456, dated Jul. 2, 2019, with English translation from WIPO.

International Search Report for PCT/CN2017/120456 dated Mar. 30, 2018 and its English translation provided by WIPO.

Written Opinion of the International Search Authority for PCT/CN2017/120456 dated Mar. 30, 2018 and its English translation provided by Google Translate.

* cited by examiner

VOLTAGE EQUALIZATION METHOD FOR USE IN RADIOFREQUENCY SWITCH HAVING MULTIPLE TRANSISTORS CONNECTED IN SERIES AND RADIOFREQUENCY SWITCH

CROSS-REFERENCE TO RELATED APPLICATIONS

The present application is the U.S. national phase of PCT Application PCT/CN2017/120456 filed on Dec. 31, 2017, which claims priority to the Chinese patent application No. 201611269013.4 filed on Dec. 31, 2016, the entire disclosures of which are hereby incorporated by reference in their entireties.

BACKGROUND

Technical Field

The present invention relates to a voltage equalization method, and in particular to a voltage equalization method for use in a radiofrequency switch having multiple transistors connected in series as well as a radiofrequency switch adopting the voltage equalization method and a corresponding communication terminal, which belong to the technical field of radiofrequency integrated circuits.

Related Art

In a transmitting and receiving circuit of a communication system, a switching technique is usually adopted to allow transmitting and receiving channels to share the same antenna, so that the size and redundancy of the circuit are reduced. A radiofrequency switch is one of control devices for controlling radiofrequency signal transmission paths and signal strength, and is applied widely in a lot of fields, such as wireless communication, electronic countermeasures, radar systems, etc. At present, in the field of high-power radiofrequency integrated circuits, a radiofrequency switch composed of multiple transistors connected in series (multi-series transistor radiofrequency switch for short) is often adopted.

As shown in FIG. 1, sources and drains of N transistors (M1-MN) of a radiofrequency switch composed of multiple transistors connected in series are connected in sequence to form a series structure. Specifically, the source (or drain) of the first transistor is connected to a radiofrequency signal input end RFin, and the source (or drain) of the last transistor is connected to a radiofrequency signal output end RFout. After the radiofrequency switch is opened, voltage between a radiofrequency signal input end and a radiofrequency signal output end will drop onto a whole series transistor chain, and partial voltage (VI-VN) will be shared between the source and the drain of each transistor. The more the number of the transistors is, the lower the voltage shared between the source and the drain of each transistor is and the less easily the transistors may be broken down. However, due to the gradual drop of voltage from each transistor, the difference of parasitic capacitors between the transistors and other reasons, the voltage shared by each transistor is different. In order to prevent the breakdown of the transistors, it is necessary to increase the number of the transistors, so that the transistors sharing the highest voltage enter a safe voltage range.

In Chinese Patent Application with the application No. 201410858446.8, Skyworks provides a radiofrequency switch module, which includes a packaging substrate configured to accommodate multiple components; and a semiconductor die mounted on the packaging substrate. The semiconductor die includes a switching device with multiple switching elements. The multiple switching elements are connected in series to form a stack. The switching element has a nonuniform distribution of parameters, and the nonuniform distribution of the parameters enables the stack to have one or more of first voltage processing capability higher than second voltage processing capability of a similar stack with the substantially uniform distribution of the parameters, a first ON resistance value less than a second ON resistance value of the similar stack and first linear performance better than second linear performance of the similar stack.

SUMMARY

The primary technical problem which the present invention needs to solve is to provide a voltage equalization method for a multi-transistor series radiofrequency switch.

Another technical problem which the present invention needs to solve is to provide a radiofrequency switch adopting the voltage equalization method and a corresponding communication terminal.

In order to achieve the foregoing purpose, the present invention adopts the following technical solution:

According to a first aspect of the embodiments of the present invention, a voltage equalization method for a multi-transistor series radiofrequency switch is provided. In the method, a capacitor is added as a parasitic capacitor between a source and a drain of each of transistors connected in series to form the radiofrequency switch, and by adjusting the parasitic capacitor of each transistor, the voltage drop uniformity of each transistor is achieved.

Preferably, the parasitic capacitor is implemented by a metal strip arranged on each transistor and a respective metal layer of each transistor.

Preferably, sources and drains of N transistors of the radiofrequency switch are connected in sequence to form a series structure including N+1 nodes.

Each node is connected to a first metal strip on a metal layer 1 through a metal and silicon contact hole, moreover, a metal layer 2 is provided with one or more second metal strips, and the second metal strip is connected to part of the first metal strip; and the first metal strips, the second metal strips and the N+1 nodes compose N parasitic capacitors; and by adjusting the size and gap of the first metal strips, the size and gap of the second metal strips and a positional relation between the first metal strips and the second metal strips, the sizes of the N parasitic capacitors are adjusted respectively, where N is a positive integer.

Preferably, the size of the metal strips is increased/decreased in a grid width direction to enlarge/reduce the area of the parasitic capacitor between the metal strips, so that the parasitic capacitor is enlarged/reduced.

Preferably, the gap between the metal strips is enlarged/reduced in a grid length direction to enlarge/reduce a gap between capacitor plates, so that the parasitic capacitor is reduced/enlarged.

Preferably, there are M second metal strips, which are respectively in perpendicular connection with previous M first metal strips on the metal layer 1, where M is a positive integer and not greater than N.

Preferably, there are M second metal strips, which are kept in a suspended state; and the second metal strips are distributed in the gaps between the first metal strips in a horizontal direction, and slightly overlap or do not overlap the first metal strips at edges of the metal strips in a vertical direction.

Preferably, there are M second metal strips, which are connected respectively to M first metal strips in the metal layer 1, so that the M second metal strips and N+1–M metal strips in the metal layer 1 compose interlayer parasitic capacitors, where M is a positive integer and not greater than N.

According to a second aspect of the embodiments of the present invention, a radiofrequency switch is provided, which is composed by sequentially connecting sources and drains of multiple transistors, and the radiofrequency switch adopts the above voltage equalization method to achieve the voltage drop uniformity of each transistor.

According to a third aspect of the embodiments of the present invention, a communication terminal is provided, which includes the above radiofrequency switch.

Compared with the prior art, the voltage equalization method provided by the present invention can finely adjust the parasitic capacitor between the source and the drain of each transistor through different combinations of the positions, sizes and gaps of the metal strips on a first metal layer and a second metal layer, thus increasing the voltage drop uniformity of each transistor. By utilizing the present invention, fewer transistors can be used to carry out the design of the radiofrequency switch.

DETAILED DESCRIPTION

The technical content of the present invention will be described in detail below with reference to the drawings and the specific embodiments.

In the prior art, as a multi-transistor series radiofrequency switch cannot sufficiently utilize the voltage withstanding capability of each transistor and the area of the radiofrequency switch is large, the application range is greatly limited. Therefore, the present invention creatively adopts a variety of parasitic capacitor distribution methods for compensating voltage shared by each transistor in the multi-transistor series radiofrequency switch, so that the voltage shared by each transistor on a transistor chain is identical or similar, and thereby fewer transistors can be used to carry out the function of the radiofrequency switch.

Figure 1:
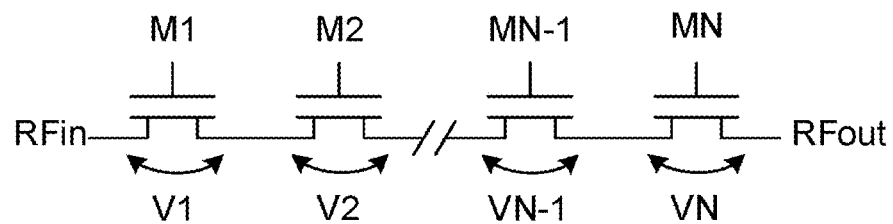
FIG. 1 is a principle diagram of a radiofrequency switch composed of multiple transistors connected in series in the prior art.
Figure 2:
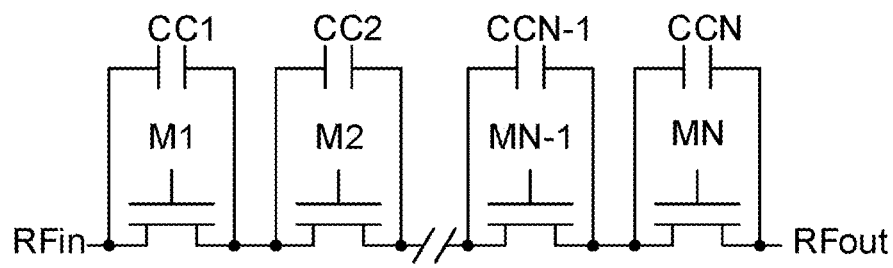
FIG. 2 is a principle diagram of a radiofrequency switch added with parasitic capacitors in the present invention.

As shown in FIG. 2, sources and drains (S/D) of N transistors (M1-MN) of a radiofrequency switch composed of multiple transistors connected in series are connected in sequence to form a series structure, where grids (G) are connected to the same control signal. The source (or drain) of M1 is connected to a radiofrequency signal input end RFin, and the drain (or source) of MN is connected to a radiofrequency signal output end RFout. When the radiofrequency switch is off, voltage between the radiofrequency signal input end and the radiofrequency signal output end will drop onto a whole series transistor chain, and partial voltage (VI-VN) will be shared between the source and the drain of each transistor. On the basis of utilizing an inherent capacitor between the source and the drain of each transistor in the multi-transistor series radiofrequency switch, the voltage equalization method provided by the present invention further adds a capacitor CC1-CCN (N is a positive integer, similarly hereinafter) as a parasitic capacitor between the source and the drain of each transistor. Through the flexible adjustment and compensation of the parasitic capacitors, the voltage shared by each transistor on the transistor chain is identical or similar as much as possible.

In one embodiment of the present invention, the parasitic capacitors CC1-CCN are implemented by metal strips arranged on the transistors and respective metal layers of the transistors. The detailed description is as follows: As the N transistors are connected in series, there are N+1 source nodes and drain nodes in total, and each node is connected to the N+1 metal strips on a metal layer 1 (a first metal layer) through a metal and silicon contact hole. There are one or more metal strips on a metal layer 2 (a second metal layer). By adjusting the size and gap of the metal strips on the metal layer 1, the size and gap of the metal strips on the metal layer 2 and a positional relation between the metal strips on the metal layer 1 and the metal layer 2, the parasitic capacitors CC1-CCN between the N+1 nodes can be adjusted, and thereby the voltage dropping onto the source and the drain of each transistor is equalized.

FIG. 3 to FIG. 6 respectively show a working principle diagram of parasitic capacitor compensation in the different embodiments of the present invention. This will be described in detail below.

Embodiment 1

Figure 3:
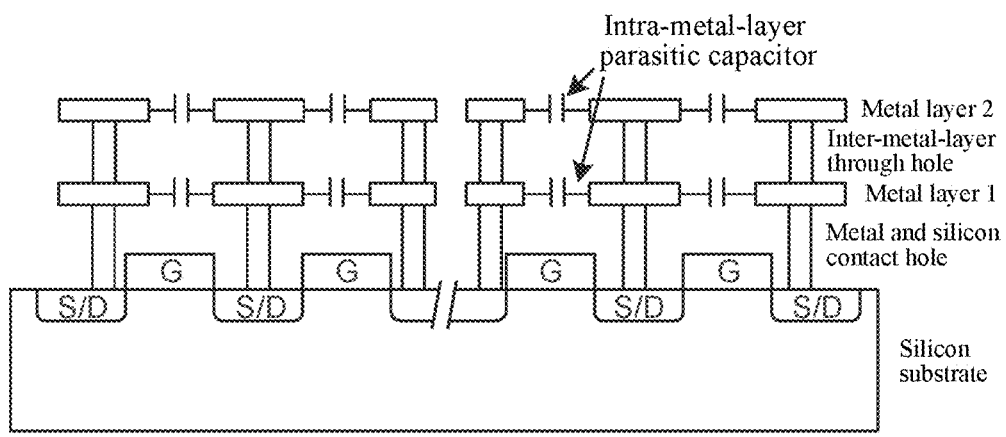
FIG. 3 is a working principle diagram of parasitic capacitor compensation in an embodiment 1 of the present invention.

As shown in FIG. 3, the metal layer 1 is provided with N+1 metal strips which are respectively in perpendicular connection with the N+1 nodes of the transistor chain, and N+1 metal strips on the metal layer 2 are respectively in perpendicular connection with the N+1 metal strips on the metal layer 1. In this method, parasitic capacitors of the same layer of metal are formed between the metal strips on the metal layer 1 and the metal layer 2. By adjusting the sizes and gaps of the metal strips on the metal layer 1 and the metal layer 2, the sizes of the parasitic capacitors between the nodes can be changed. Increasing the size of the metal strips in a grid width direction can enlarge the area of the parasitic capacitor between the metal strips, so that the parasitic capacitor is enlarged; otherwise, decreasing the size can reduce the parasitic capacitor. Increasing the gap between the metal strips in a grid length direction is equivalent to increasing a gap between capacitor plates, so that the parasitic capacitor can be reduced; and otherwise, decreasing the gap can enlarge the parasitic capacitor.

Embodiment 2

Figure 4:
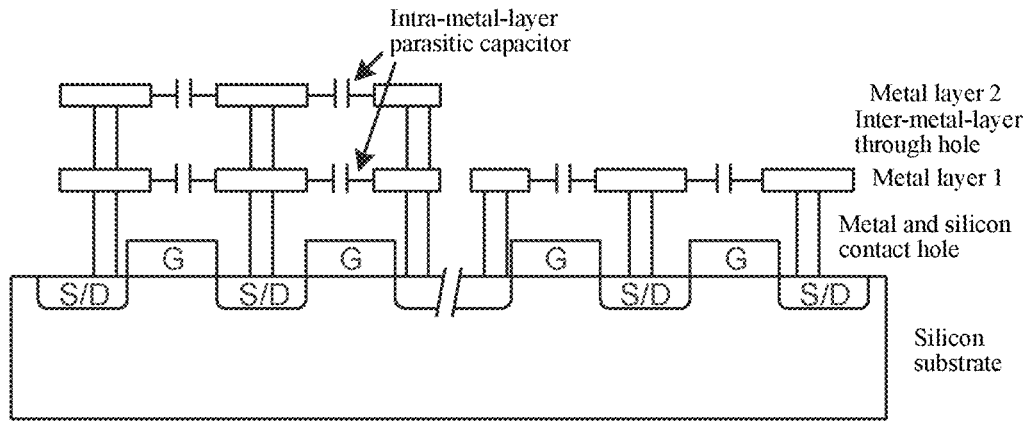
FIG. 4 is a working principle diagram of parasitic capacitor compensation in an embodiment 2 of the present invention.

As shown in FIG. 4, the metal layer 1 is provided with N+1 metal strips which are respectively in perpendicular connection with N+1 nodes of a transistor chain, and M (M is a positive integer, similarly hereinafter) metal strips on the metal layer 2 are respectively in perpendicular connection with the previous M metal strips on the metal layer 1. In this method, parasitic capacitors of the same layer of metal are only added on the previous M nodes, and because voltage shared by the previous transistors is usually low, more parasitic capacitors need to be added to increase the shared voltage. The parasitic capacitors used in this method are the same parasitic capacitors of the same layer of metal as that in embodiment 1, so the adjustment method is the same.

Embodiment 3

Figure 5:
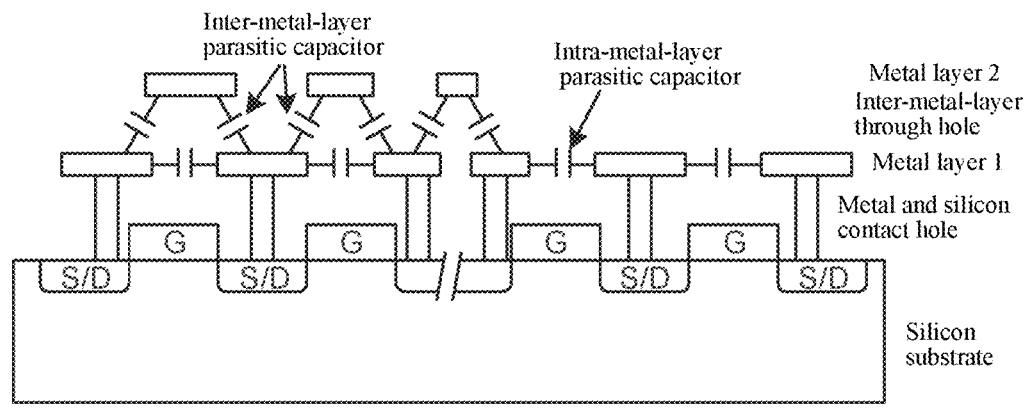
FIG. 5 is a working principle diagram of parasitic capacitor compensation in an embodiment 3 of the present invention.

As shown in FIG. 5, the metal layer 1 is provided with N+1 metal strips which are respectively in perpendicular connection with N+1 nodes of a transistor chain, M metal strips on the metal layer 2 are kept in a suspended state, the metal strips on the metal layer 2 are distributed in the gaps between the metal strips on the metal layer 1 in a horizontal direction, and in a vertical direction, the metal strips on the metal layer 2 and the metal layer 1 can be overlapped at edges of the metal strips or are not overlapped. In this method, a main capacitor implementation method is to introduce interlayer capacitors formed between the metal strips of the metal layer 1 and the metal layer 2 between the nodes for compensation. In general, an interlayer parasitic capacitor is smaller than an intra-layer inter-metal parasitic capacitor, so this method mainly uses the parasitic capacitors on the metal layer 1 for major compensation and the parasitic capacitors on the metal layer 2 for minor adjustment. The adjustment of the size and gap of the metal strips in the metal layer 1 is the same as that in the embodiment 1 and the embodiment 2. By adjusting the size of the metal strips in the metal layer 2 and a positional relation between the metal strips in the metal layer 2 and the metal strips in the metal layer 1, if the metal strips in the metal layer 2 and the metal strips on the metal layer 1 more overlap or are closer to each other in the vertical direction, the introduced parasitic capacitors will be bigger; and otherwise, the parasitic capacitors will be smaller.

Embodiment 4

Figure 6:
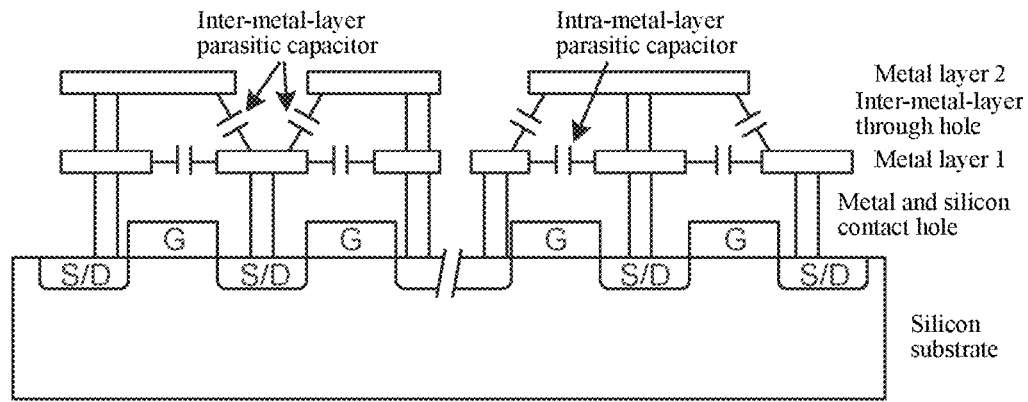
FIG. 6 is a working principle diagram of parasitic capacitor compensation in an embodiment 4 of the present invention.

As shown in FIG. 6, the metal layer 1 is provided with N+1 metal strips which are respectively in perpendicular connection with N+1 nodes of a transistor chain, the metal layer 2 is provided with M metal strips which are connected to M metal strips in the metal layer 1, and the M metal strips of the metal layer 2 and the N+1−M metal strips in the metal layer 1 compose interlayer parasitic capacitors. In this method, the distribution of the capacitors is more disperse, and only the inter-node capacitors distributed at different positions on the metal layer 2 undergo minor adjustment, while major compensation is mainly carried out by the capacitors of the metal layer 1. The adjustment method is the same as that in the embodiment 1, the embodiment 2 and the embodiment 3. For intra-layer parasitic capacitors, increasing the size of the metal strips in a grid width direction can enlarge the parasitic capacitor; otherwise, decreasing the size can reduce the parasitic capacitor. Increasing a gap between the metal strips in a grid length direction is equivalent to increasing a gap between capacitor plates, so that the parasitic capacitor can be reduced; otherwise, decreasing the gap can enlarge the parasitic capacitor. For the interlayer parasitic capacitors, by adjusting the size of the metal strips in the metal layer 2 and a positional relation between the metal strips in the metal layer 2 and the metal strips in the metal layer 1, if the metal strips in the metal layer 2 and the metal strips on the metal layer 1 more overlap or are closer to each other in the vertical direction, the introduced parasitic capacitors will be bigger; and otherwise, the smaller the parasitic capacitors will be.

It should be noted that by the parasitic capacitor adjustment methods provided by the embodiment 1, the embodiment 2, the embodiment 3 and the embodiment 4 in combination with a device parasitic parameter simulation tool, each parasitic capacitor between the nodes can be adjusted finely, consequently, the equalization of the voltage of each transistor point is realized, the voltage withstanding capability of each transistor is utilized sufficiently, the number of the transistors is decreased, and the area of the radiofrequency switch is reduced. An experiment proves that when fourteen series transistors are used to produce a transistor chain as the radiofrequency switch, the voltage equalization method provided by the present invention is adopted, parasitic parameter simulation software is used to simulate the parasitic parameter of each node, and node voltages are normalized, where a standard value is 100%. The comparison of experiment results is as follows: when the voltage equalization method provided by the present invention is not used for adjustment, voltage difference between the nodes is between 77% and 185%; and after the voltage equalization method provided by the present invention is used for adjustment, the voltage difference between the nodes is between 97.2% and 103.7%. By comparison, the voltage equalization method provided by the present invention can effectively equalize internal voltages in the multi-transistor series radiofrequency switch.

Compared with the prior art, the voltage equalization method provided by the present invention can finely adjust the parasitic capacitor between the source and the drain of each transistor through the different combinations of the positions, sizes and gaps of the metal strips on the metal layer 1 and the metal layer 2, thus increasing the voltage drop uniformity of each transistor. By utilizing the present invention, fewer transistors can be used to carry out the design of the radiofrequency switch.

The voltage equalization method shown in the above embodiments can be used in a radiofrequency switch chip. Sources and drains of multiple transistors are connected in sequence to compose the radiofrequency switch chip. The specific structure of the radiofrequency switch chip is not described in detail herein anymore.

In addition, the above radiofrequency switch chip can be used in a communication terminal to serve as an important component of a radiofrequency integrated circuit. The communication terminal mentioned herein means a computer device supporting a variety of communication systems (such as GSM, EDGE, TD_SCDMA, TDD_LTE, FDD_LTE, etc.) which can be used in mobile environment, including a mobile phone, a laptop, a tablet personal computer, an on-board computer, etc. In addition, the technical solution provided by the present invention is also applicable to other places applying radiofrequency integrated circuits, such as communication base stations, etc.

The voltage equalization method for a multi-transistor series radiofrequency switch and the radiofrequency switch which are provided by the present invention have been described in detail above. For a person of ordinary skill in the art, any apparent change made thereon without departing from the essence of the present invention shall be considered a violation of the patent right of the present invention, and shall bear a corresponding legal responsibility.

What is claimed is:

1. A voltage equalization method for a multi-transistor series radiofrequency switch, wherein a parasitic capacitor is implemented by a metal strip arranged on each transistor and a respective metal layer of each transistor between a source and a drain of each of transistors connected in series to form the radiofrequency switch, the parasitic capacitor comprises an intra-layer parasitic capacitor between metal strips on same metal layer and an interlayer parasitic capacitor between metal strips on adjacent metal layers, wherein:

by adjusting the intra-layer parasitic capacitor and the interlayer parasitic capacitor of each transistor, a voltage drop uniformity of each transistor is achieved, wherein the intra-layer parasitic capacitor is used for major compensation and the interlayer parasitic capacitor is used for minor adjustment.

2. The voltage equalization method according to claim 1, wherein a size of the metal strips is increased/decreased in a grid width direction to enlarge/reduce an area of the parasitic capacitor between the metal strips, so that the intra-layer parasitic capacitor is enlarged/reduced.

3. The voltage equalization method according to claim 1, wherein a gap between the metal strips is enlarged/reduced in a grid length direction to enlarge/reduce a gap between capacitor plates, so that the intra-layer parasitic capacitor is reduced/enlarged.

4. The voltage equalization method according to claim 1, wherein there are M second metal strips, which are connected respectively to M first metal strips in a first metal layer, so that the M second metal strips and N+1−M metal strips in the first metal layer compose interlayer parasitic capacitors, wherein M is a positive integer and not greater than N.

5. A radiofrequency switch, composed by sources and drains of N transistors which are connected in sequence to form a series structure comprising N+1 nodes, wherein N is a positive integer;

each node is connected to a first metal strip on a first metal layer through a metal and silicon contact hole, a second metal layer is provided with one or more second metal strips, and the second metal strip is connected to part of the first metal strip; the first metal strips, the second metal strips and the N+1 nodes compose N parasitic capacitors; and by adjusting a size and gap of the first metal strips, a size and gap of the second metal strips and a positional relation between the first metal strips and the second metal strips, the sizes of the N parasitic capacitors are adjusted respectively, wherein the parasitic capacitor comprises an intra-layer parasitic capacitor between metal strips on same metal layer and an interlayer parasitic capacitor between metal strips on adjacent metal layers, the intra-layer parasitic capacitor is used for major compensation and the interlayer parasitic capacitor is used for minor adjustment.

6. A communication terminal, wherein the communication terminal comprises the radiofrequency switch according to claim 5.

7. The radiofrequency switch according to claim 5, wherein the size of the metal strips is increased/decreased in a grid width direction to enlarge/reduce an area of the parasitic capacitor between the metal strips, so that the intra-layer parasitic capacitor is enlarged/reduced.

8. The radiofrequency switch according to claim 5, wherein the gap between the metal strips is enlarged/reduced in a grid length direction to enlarge/reduce a gap between capacitor plates, so that the intra-layer parasitic capacitor is reduced/enlarged.

9. The radiofrequency switch according to claim 5, wherein there are M second metal strips, which are connected respectively to M first metal strips in the first metal layer, so that the M second metal strips and N+1−M metal strips in the first metal layer compose interlayer parasitic capacitors, wherein M is a positive integer and not greater than N.

* * * * *